(12) United States Patent
Lossin et al.

(10) Patent No.: US 12,056,376 B2
(45) Date of Patent: *Aug. 6, 2024

(54) INTERCONNECTED MEMORY GRID WITH BYPASSABLE UNITS

(71) Applicant: Next Silicon Ltd, Givatayim (IL)

(72) Inventors: Yoav Lossin, Bitan Aharon (IL); Ron Schneider, Ramat Gan (IL); Elad Raz, Ramat Gan (IL); Ilan Tayari, Tzur Hadassa (IL); Eyal Nagar, Macabim Reut (IL)

(73) Assignee: Next Silicon Ltd, Givatayim (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,262

(22) Filed: May 8, 2023

(65) Prior Publication Data

US 2023/0273736 A1 Aug. 31, 2023

Related U.S. Application Data

(63) Continuation of application No. 17/588,352, filed on Jan. 31, 2022, now Pat. No. 11,644,990, which is a continuation of application No. 16/856,072, filed on Apr. 23, 2020, now Pat. No. 11,269,526.

(51) Int. Cl.
*G06F 3/06* (2006.01)
*G06F 13/40* (2006.01)
*G11C 29/00* (2006.01)

(52) U.S. Cl.
CPC .......... *G06F 3/0635* (2013.01); *G06F 3/0604* (2013.01); *G06F 3/0683* (2013.01); *G06F 13/4027* (2013.01); *G11C 29/70* (2013.01)

(58) Field of Classification Search
CPC .... G06F 3/0635; G06F 3/0604; G06F 3/0683; G06F 13/4027; G06F 12/0646; G11C 29/70

See application file for complete search history.

(56) References Cited

U.S. PATENT DOCUMENTS

| | | | | |
|---|---|---|---|---|
| 6,070,003 A | * | 5/2000 | Gove | G06F 15/17375 710/317 |
| 7,124,213 B2 | * | 10/2006 | Cochran | G06F 11/1666 710/51 |
| 9,823,986 B2 | * | 11/2017 | Li | G06F 11/10 |

* cited by examiner

*Primary Examiner* — Idriss N Alrobaye
*Assistant Examiner* — Richard B Franklin

(57) ABSTRACT

A device for executing a software program by at least one computational device, comprising an interconnected computing grid, connected to the at least one computational device, comprising an interconnected memory grid comprising a plurality of memory units connected by a plurality of memory network nodes, each connected to at least one of the plurality of memory units; wherein configuring the interconnected memory comprises: identifying a bypassable memory unit; selecting a backup memory unit connected to a backup memory network node; configuring the respective memory network node connected to the bypassable memory unit to forward at least one memory access request, comprising an address in a first address range, to the backup memory network node; and configuring the backup memory network node to access the backup memory unit in response to the at least one memory access request, in addition to accessing the respective at least one memory unit connected thereto.

17 Claims, 5 Drawing Sheets

INTERCONNECTED MEMORY GRID WITH BYPASSABLE UNITS

RELATED APPLICATION

This application is a continuation of U.S. patent application Ser. No. 17/588,352, filed on Jan. 31, 2022, which is a continuation of U.S. patent application Ser. No. 16/856,072 filed on Apr. 23, 2020, now U.S. Pat. No. 11,269,526, the contents of which are incorporated herein by reference in their entirety.

FIELD AND BACKGROUND OF THE INVENTION

Some embodiments described in the present disclosure relate to an interconnected memory grid and, more specifically, but not exclusively, to a device comprising an interconnected memory grid.

As used herein, the term "memory unit" refers to addressable digital memory and circuitry for addressing and accessing the digital memory. Some examples of digital memory are volatile digital storage, for example static random-access memory (SRAM), dynamic random-access memory (DRAM), and synchronous dynamic random-access memory (SDRAM). Some other examples of digital memory are non-volatile digital storage, for example non-volatile disk storage, read-only memory (ROM), erasable programmable read-only memory (EPROM), electrically erasable programmable read-only memory (EEPROM), and non-volatile random-access memory (NVRAM). Some digital memory is electrically addressed. Some digital memory is mechanically addressed.

There exist memory architectures that comprise a plurality of memory units, where each of the plurality of memory units is associated with one of a plurality of address ranges. In some such memory architectures the plurality of address ranges are mutually exclusive. For example, each of the plurality of address ranges may be a sub-range of an address space, unique in the plurality of address ranges. In such a memory architecture, each memory unit of the plurality of memory units responds to one or more commands directed to a respective address range associated with the memory unit, and only to the respective address range associated with the memory unit. A memory access request typically comprises a memory command and a memory address. Some examples of a memory command are a load command, a store command, a swap command, a cache flush command, and a cache commit command. Some other examples of a memory command are an atomic load command, an atomic store command, an atomic fetch-and-operate command, for example fetch-and-increment and fetch-and-decrement, and an atomic compare-and-swap command. When a memory architecture receives a memory access request directed to an address in an address range associated with one of the plurality of memory units there is a need to deliver the memory access request to the memory unit associated with the address range.

In some memory architectures comprising a plurality of memory units, the memory units are interconnected, such that one memory unit of the plurality of memory units is connected to one or more other memory units of the plurality of memory units via one of a plurality of memory network nodes. In some such architectures, delivering the memory access command comprises receiving the memory access command by one of the plurality of memory network nodes and forwarding the memory access command, by one or more other memory network nodes, until received by the memory unit.

For brevity, henceforth the term "interconnected memory" means a memory comprising a plurality of memory units connected by a plurality of memory network nodes.

There may be a need to bypass one or more of the plurality of memory units. One example is when a memory unit is faulty, for example when the digital memory of the memory unit is corrupted. Another example is when the plurality of memory units is used to implement an identified memory space and there is a need to use the memory unit for a purpose other than being part of the identified memory space. In some systems comprising a plurality of memory units as described above, the plurality of memory network nodes are configured to be associated with the plurality of address ranges when the system starts operating. In some systems, the plurality of memory network nodes may be re-configured while the system operates. In some such systems, the plurality of memory network nodes may be re-configured to bypass one or more memory units.

In some systems, configuring the plurality of memory network nodes comprises configuring for each memory network node how the memory network node forwards a memory access command directed to an address in an address range that the memory network node is not associated with. When there is a need to bypass one or more memory units, associated with one or more address ranges, there may be a need to reconfigure one or more memory network nodes to correctly forward a memory access command directed to an address in the one or more address ranges.

SUMMARY OF THE INVENTION

It is an object of the present disclosure to describe a system and a method for an interconnected memory grid with bypassable units.

The foregoing and other objects are achieved by the features of the independent claims. Further implementation forms are apparent from the dependent claims, the description and the figures.

According to a first aspect of the invention, a device for executing a software program by at least one computational device comprises an interconnected computing grid, connected to the at least one computational device, comprising an interconnected memory grid comprising a plurality of memory units connected by a plurality of memory network nodes, each connected to at least one of the plurality of memory units. Optionally, configuring the interconnected memory comprises: identifying a bypassable memory unit in the plurality of memory units; selecting a backup memory unit of the plurality of memory units, connected to a backup memory network node of the plurality of memory network nodes; configuring the respective memory network node connected to the bypassable memory unit to forward at least one memory access request, comprising an address in a first address range, to the backup memory network node; and configuring the backup memory network node to access the backup memory unit in response to the at least one memory access request, in addition to accessing the respective at least one memory unit connected thereto in response to at least one other memory access request comprising another address in a second address range.

According to a second aspect of the invention, a method for bypassing a bypassable memory unit of an interconnected memory grid comprising a plurality of memory units connected by a plurality of memory network nodes, each connected to at least one of the plurality of memory units comprises: identifying a bypassable memory unit in the plurality of memory units; selecting a backup memory unit of the plurality of memory units, connected to a backup memory network node of the plurality of memory network nodes; configuring the respective memory network node connected to the bypassable memory unit to forward at least one memory access request, comprising an address in a first address range, to the backup memory network node; and configuring the backup network node to access the backup memory unit in response to the at least one memory access request, in addition to accessing the respective at least one memory unit connected thereto in response to at least one other memory access request comprising another address in a second address range.

According to a third aspect of the invention, a system for executing a software program, comprises a device for executing the software program by at least one computational device, comprising an interconnected computing grid, connected to the at least one computational device, comprising an interconnected memory grid comprising a plurality of memory units connected by a plurality of memory network nodes, each connected to at least one of the plurality of memory units; and at least one hardware processor connected to the device and adapted for: identifying a bypassable memory unit in the plurality of memory units; selecting a backup memory unit of the plurality of memory units, connected to a backup memory network node of the plurality of memory network nodes; configuring the respective memory network node connected to the bypassable memory unit to forward at least one memory access request, comprising an address in a first address range, to the backup memory network node; and configuring the backup network node to access the backup memory unit in response to the at least one memory access request, in addition to accessing the respective at least one memory unit connected thereto in response to at least one other memory access request comprising another address in a second address range.

With reference to the first and second aspects, in a first possible implementation of the first and second aspects of the present invention prior to configuring the backup network node to access the backup memory unit in response to the at least one memory access request, the respective memory network node connected to the bypassable memory unit was configured to access the bypassable memory unit in response to at least one previous memory access request addressed to the address in the first address range. Optionally, the bypassable memory unit is identified according to a faulty memory area connected thereto. Configuring the backup network node with the first address range previously associated with the respective memory network node increases usability of the device allowing continued use of the device after identification of a need to bypass the bypassable memory unit. In addition, configuring the backup network node with the first address range previously associated with the respective memory network node facilitates decreasing an amount of nodes that a memory access request traverses in the device, thus reducing latency in responding to the memory access request.

With reference to the first and second aspects, in a second possible implementation of the first and second aspects of the present invention the bypassable memory unit is one of a plurality of bypassable memory units identified in the plurality of memory units. Optionally configuring the interconnected memory grid further comprises, for at least one other bypassable memory unit of the plurality of bypassable memory units: selecting another backup memory network unit of the plurality of memory units connected to another backup memory network node of the plurality of memory network nodes; configuring the respective memory network node connected to the other bypassable memory unit to forward at least one additional memory access request, comprising another address in another first address range, to the other backup memory network node; and configuring the other backup network node to access the other backup memory unit in response to the at least one other memory access request, in addition to accessing the other respective at least one memory unit connected thereto in response to at least one additional other memory access request comprising an additional other address in a second other address range.

With reference to the first and second aspects, in a third possible implementation of the first and second aspects of the present invention the plurality of memory nodes is arranged in an identified pattern, and the backup memory network node is connected to the respective memory network node connected to the bypassable memory unit according to the identified pattern. Optionally, the identified pattern is a two-dimensional grid, such that each node of the plurality of memory network nodes has four neighbor directions and is connected on each respective neighbor direction thereof to at most one other node of the plurality of memory network nodes. Selecting a backup memory node that is a neighbor connected to the respective memory network node connected to the bypassable memory unit reduces disruption to routing of the memory access request, thus increases stability of the device's operation.

With reference to the first and second aspects, in a fourth possible implementation of the first and second aspects of the present invention the interconnected computing grid further comprises a plurality of reconfigurable logical elements comprising a plurality of sets of reconfigurable logical elements, the software program comprises a plurality of basic blocks, executing the software program by the at least one computational device comprises configuring the interconnected grid to execute at least one of the plurality of basic block using at least one of the plurality of sets of reconfigurable logical elements, and configuring the backup network node to access the backup memory unit is while the at least one set of reconfigurable logical elements executes the at least one basic block. Optionally, each of the plurality of memory units further comprises a plurality of memory entry points, each of the plurality of sets of reconfigurable logical elements is associated with one of the plurality of memory units and connected thereto via at least one of the plurality of memory entry points thereof, and the at least one memory access request is sent from the at least one set of reconfigurable logical elements to the respective at least one memory unit associated therewith via at least one memory entry point of the respective at least one memory unit's plurality of memory entry points. Optionally, the at least one memory entry point is configured to receive from the at least one set of reconfigurable logical elements at least one additional other memory access request comprising at least one requested memory address selected from: a physical memory address in a physical address space of the at least one computational device, a virtual memory address in a virtual address space of the at least one computational device, a local memory address of the interconnected memory grid, a device memory address of a memory component connected to the interconnected computing grid, and another device memory address of another memory component connected to another interconnected computing grid connected to the interconnected computing grid. Optionally, the interconnected computing grid further comprises an interconnect network comprising a plurality of ingress ports and a plurality of egress ports, and the at least one set of reconfigurable logical elements is connected to each of the at least one memory entry point via one of: an egress port of the interconnected network, and an ingress port of the interconnected network.

With reference to the first and second aspects, in a fifth possible implementation of the first and second aspects of the present invention the first address range is one of an identified plurality of address ranges, the second address range is another of the identified plurality of address ranges, and each of the identified plurality of address ranges is one of: a range of local memory addresses of the interconnected memory grid, and a range of device memory addresses of a memory component connected to the interconnected computing grid. Selecting the first address range and the second address range from a range of local memory addresses of the interconnected memory grid or a range of device memory addresses of a memory component connected to the interconnected computing grid increases usability of the device.

With reference to the first and second aspects, in a sixth possible implementation of the first and second aspects of the present invention each of the plurality of memory units is associated with at least one memory area selected from: a memory area of a plurality of memory areas of the interconnected memory grid, and a stack-based-allocation memory area. Optionally, each of the plurality of memory units is connected to the respective memory network node via a memory interface unit of a plurality of memory interface units of the interconnected memory grid, the respective memory interface unit connected to a memory unit of the plurality of memory units is further connected to the respective at least one memory area associated with the memory unit, a memory management unit of the memory unit, and at least one of the plurality of memory entry points of the memory unit, and the respective memory interface is configured to: receive a memory access request from one of: the at least one of the plurality of memory entry points connected thereto and the respective memory network node connected thereto; and access, in response to the memory access request, at least one of: the respective at least one memory area, the respective memory management unit connected thereto, the respective at least one memory entry point connected thereto, and the respective memory network node connected thereto.

With reference to the first and second aspects, in a seventh possible implementation of the first and second aspects of the present invention the at least one memory access request comprises a memory command selected from a group of memory commands consisting of: a load command, a store command, an atomic load command, an atomic store command, an atomic fetch-and-operate command, a swap command, an atomic compare-and-swap command, a cache flush command and a cache commit command.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which embodiments. Although methods and materials similar or equivalent to those described herein can be used in the practice or testing of embodiments, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments are herein described, by way of example only, with reference to the accompanying drawings. With specific reference now to the drawings in detail, it is stressed that the particulars shown are by way of example and for purposes of illustrative discussion of embodiments. In this regard, the description taken with the drawings makes apparent to those skilled in the art how embodiments may be practiced.

DESCRIPTION OF SPECIFIC EMBODIMENTS OF THE INVENTION

Some embodiments described in the present disclosure relate to an interconnected memory grid and, more specifically, but not exclusively, to a device comprising an interconnected memory grid.

In an interconnected memory, a neighbor memory network node of a memory network node is another of the plurality of memory network nodes connected to the memory network node. A memory network node may have one or more neighbor memory network nodes, according to a topological organization of the plurality of memory network nodes. For example, when the interconnected memory network node is a two-dimensional grid, a memory network node may have two neighbors when the memory network node is located in a corner of the two-dimensional grid, three neighbors when located along a side of the two-dimensional grid and four neighbors when located inside the grid. In another example, when the interconnected memory network node is a three-dimensional grid, a memory network node may have three neighbors when located in a corner of the three-dimensional grid.

For brevity, henceforth the term "neighbor" is used to mean a neighbor memory network node, and the terms are used interchangeably.

Figure 1:
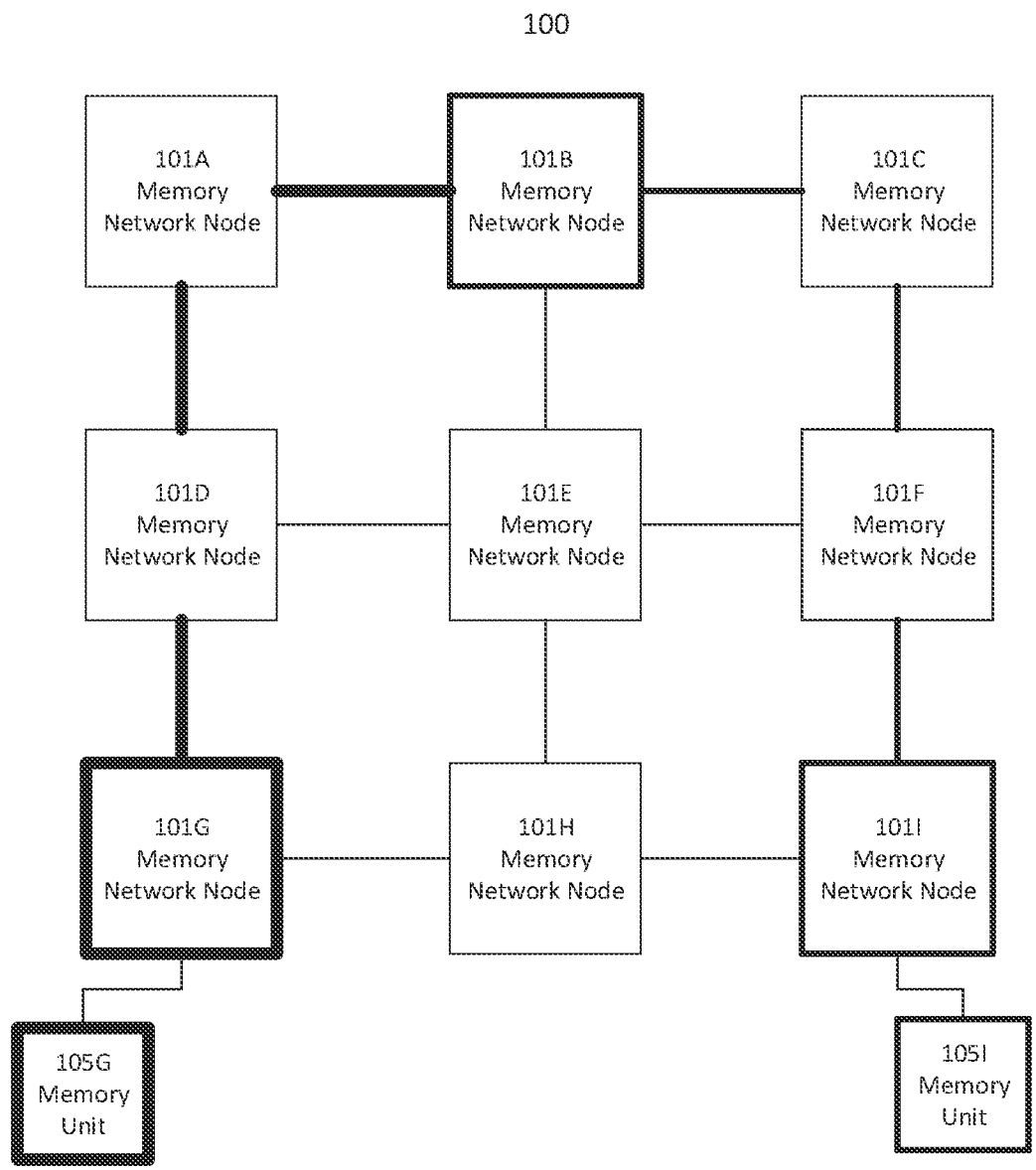
FIG. 1 is a schematic block diagram of an exemplary interconnected memory.

Reference is now made to FIG. 1, showing a schematic block diagram of an exemplary interconnected memory 100, comprising a plurality of memory network nodes 101A through 101I. In this example, plurality of memory network nodes 101A through 101I is arranged in a two dimensional grid. For example, memory network node 101B has three neighbors: memory network node 101A, memory network node 101C and memory network node 101E.

In some existing methods for using an interconnected memory there is a need for a memory network node to select, for a memory access command, a neighbor to forward the memory access command thereto. In some methods a memory network node selects the neighbor according to an address range of an address in the memory access command. In some other methods the memory network node selects the neighbor according to another memory network node associated with the address in the memory access command. In some methods neighbor selection for routing is static, where an identified neighbor is selected for all memory access commands directed to an identified address range or an identified memory network node. In some methods neighbor selection for routing is dynamic. The identified neighbor may be selected according to a topological arrangement of the plurality of memory network nodes, for example when the neighbor is connected to the memory network node in a shortest path from the memory network node to the identified memory network node. For example, in FIG. 1 when memory network node 101B has to forward a memory access command directed to memory unit 105I connected to memory network node 101I, memory network node 101B may forward the memory access command to memory network node 101C or memory network node 101E for a shortest path connecting memory network node 101B to memory network node 101I. In another example, the neighbor may be connected to the memory network node in a least congested path from the memory network node to the identified memory network node.

Some existing methods for using an interconnected memory include configuring for each memory network node, for each of the plurality of address ranges and additionally or alternatively for each of the plurality of memory network nodes, one or more parameters for selecting a neighbor to forward the memory access command thereto. For example, when neighbor selection for routing is static, a memory network node may be configured for another of the plurality of address ranges with an identified neighbor of the memory network node's one or more neighbors. For example, in FIG. 1 memory network node 101B may be configured to select memory network node 101C for forwarding a memory access command directed to an address range associated with memory unit 105I connected to memory network node 101I.

In some systems implementing such a method, when a memory unit of the plurality of memory units is bypassed, an identified address range associated with the memory unit is associated with another memory unit of the plurality of memory units. For example, in FIG. 1 when there is a need to bypass memory unit 101I, an identified address range associated with memory unit 105I may now be associated with memory unit 105G.

When the address range is associated with another memory unit, there may be a need to change the configuration of one or more nodes of the plurality of memory network nodes. For example, in FIG. 1 when using memory unit 105G instead of memory unit 105I there may be a need to configure memory network node 101B to forward a memory access command directed to an address in the identified address range to memory network node 101A instead of to memory network node 101C.

In common existing methods, when bypassing one or more memory units there is frequently a need to configure more than one of the plurality of memory network nodes. It may be the case that there is a need to configure all of the plurality of memory network nodes. Configuration of more than one or two of the plurality of memory network nodes may be disruptive to the operation of a system, and may require stopping the system for reconfiguration.

To reduce disruption to the operation of a system when there is a need to bypass a bypassable memory unit, the present disclosure proposes, in some embodiments described therein, configuring a memory network node connected to the bypassable memory unit to forward one or more memory access requests to a backup memory network node selected from the plurality of memory network nodes and connected to a backup memory unit of the plurality of memory units. Optionally, the one or more memory access requests each comprise an address in an identified address range, and the backup memory network node is optionally configured to access the backup memory unit in response to the one or more memory access requests, in addition to accessing one or more other memory units connected thereto in response to one or more other memory access requests comprising another address in another address range. Configuring the memory network node connected to the bypassable memory unit to forward the one or more memory access requests to the backup memory node allows other memory nodes of the plurality of memory nodes to forward one or more memory access commands to the backup memory node without a need to reconfigure the other memory nodes. Configuring the backup memory node to access the backup memory unit in addition to accessing the one or more other memory units connected thereto allows further executing the one or more other memory access requests without a need to reconfigure the other memory nodes. Bypassing a memory unit without reconfiguring other of the plurality of memory nodes reduces disruption of a service provided by a system implemented as described above, increasing availability of the service. In addition, Bypassing the memory unit without reconfiguring other of the plurality of memory nodes reduces an amount of time required to bypass the memory unit, increasing availability of the service and reducing cost of operation of the system.

Optionally, the interconnected memory grid is contained by an interconnected computing grid. Optionally, the interconnected computing grid is connected to one or more computational devices for executing a software program. Optionally, the interconnected computing grid further comprises a plurality of reconfigurable logical elements. Optionally, the software program comprises a plurality of basic blocks, where a basic block is a sequence of consecutive computer instructions of the software program executed consecutively, such that there is no jump from or to a computer instruction in the sequence (other than jumping to a head instruction of the sequence or jumping from a tail instruction of the sequence). Optionally, executing the software program comprises executing one or more of the plurality of basic blocks by at least some of the plurality of reconfigurable logical elements. According to some embodiments described in the present disclosure, the backup memory node is configured to access the backup memory unit while the at least some of the plurality of reconfigurable logical elements execute the one or more basic blocks.

In addition, according to some embodiments described in the present disclosure, each of the plurality of memory units comprises a plurality of memory entry points. Optionally, the at least some of the plurality of reconfigurable logical elements are associated with one of the plurality of memory units. Optionally, the at least some of the plurality of reconfigurable logical elements is connected to the respective memory unit associated therewith via one or more of the plurality of memory entry points of the respective memory unit. Optionally, the at least some of the plurality of reconfigurable logical elements send the one or more memory access requests to the respective memory unit associated therewith via the one or more of the plurality of memory entry points of the respective memory unit. Optionally, at least part of the interconnected memory grid is configured to cache a memory of the one or more computational devices. When at least part of the interconnected memory grid is configured to cache a memory of the one or more computational devices, a memory address contained in a memory access request may be a physical memory address in a physical address space of the one or more computational devices. Optionally, the memory address contained in the memory access request is a virtual memory address in a virtual address space of the one or more computational devices. Optionally, at least another part of the interconnected memory grid is configured to provide local memory to the at least some of the plurality of reconfigurable logical elements. In such a case, the memory address contained in the memory access request is optionally a local memory address of the interconnected memory grid. Optionally, the interconnected computing grid is connected to a memory component, and the memory address contained in the memory access request is optionally a device memory address of the memory component. Optionally, the interconnected computing grid is connected to another interconnected computing grid. Optionally, the other interconnected computing grid is connected to another memory component, and the memory address contained in the memory access request is optionally another device memory address of the other memory component. Optionally, each of the plurality of memory entry points is configured to receive one type of memory address. Connecting the at least some of the plurality of logical elements to the interconnected memory grid via one or more memory entry points of one of the plurality of memory units allows the interconnected memory grid to simultaneously support memory access commands directed to more than one type of memory, for example simultaneously supporting memory access commands directed to a virtual address space of the one or more computational devices and a device address space of a memory component connected to the interconnected computing grid. Simultaneously supporting memory access commands directed to more than one type of memory increased usability of an interconnected computing grid comprising an interconnected memory as described above, compared to an interconnected memory that supports access to only one type of memory.

Before explaining at least one embodiment in detail, it is to be understood that embodiments are not necessarily limited in its application to the details of construction and the arrangement of the components and/or methods set forth in the following description and/or illustrated in the drawings and/or the Examples. Implementations described herein are capable of other embodiments or of being practiced or carried out in various ways.

Embodiments may be a system, a method, and/or a computer program product. The computer program product may include a computer readable storage medium (or media) having computer readable program instructions thereon for causing a processor to carry out aspects of the embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments.

Aspects of embodiments are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
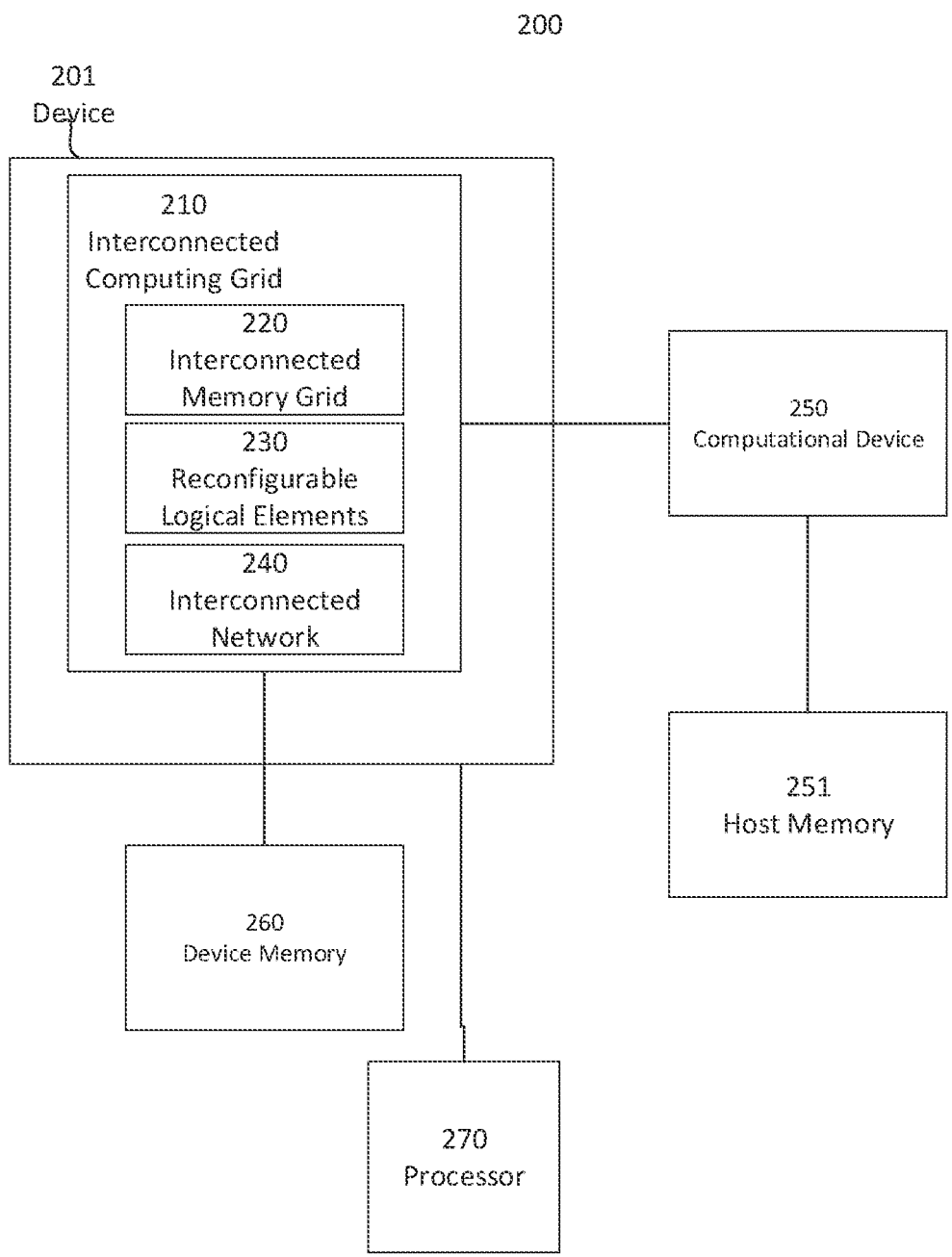
FIG. 2 is a schematic block diagram of a system, according to some embodiments.

Reference is now made also to FIG. 2, showing a schematic block diagram of a system 200, according to some embodiments. In such embodiments, device 201 is connected to one or more computational devices 250, optionally for the purpose of executing a software program. Optionally, the software program comprises a plurality of basic blocks. Optionally, one or more computational devices 250 are connected to a host memory 251, optionally addressable via a virtual address space of one or more computational devices 250. Optionally, host memory 251 is addressable via a physical address space of one or more computational devices. Optionally, device 201 comprises interconnected computing grid 210, optionally connected to one or more computational devices 250. Optionally, interconnected computing grid comprises interconnected memory grid 220.

Figure 3A:
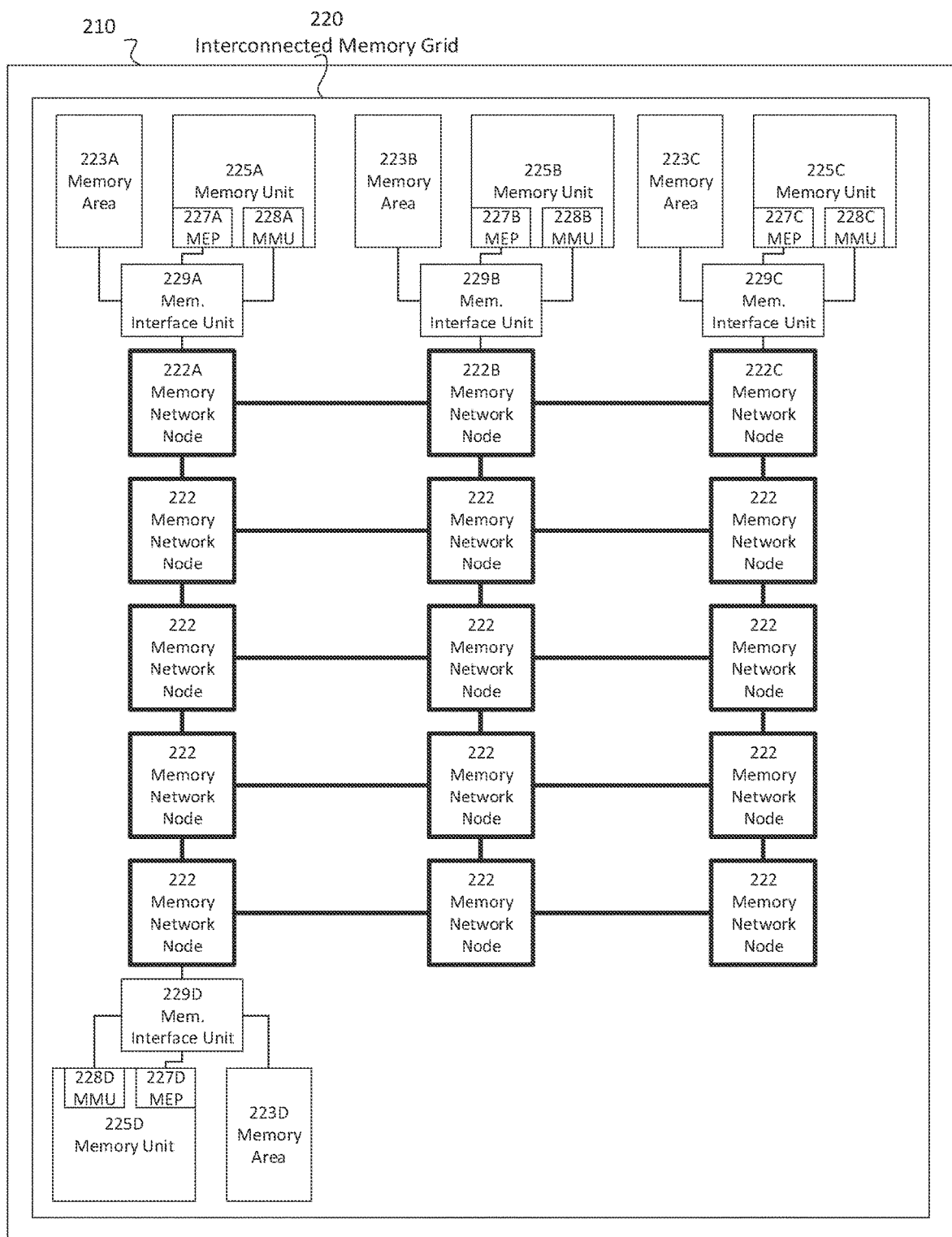
FIG. 3A is a schematic block diagram of an interconnected computing grid, according to some embodiments.

References is now made also to FIG. 3A, showing a schematic block diagram of an interconnected computing grid 210, according to some embodiments. In such embodiments, interconnected memory grid 220 comprises a plurality of memory units for example comprising memory unit 225A, memory unit 225B, memory unit 225C and memory unit 225D. Optionally, interconnected memory grid 220 comprises a plurality of memory network nodes 222 (collectively referred to as plurality of memory network nodes 222, and each individually referred to as a memory network node 222), further comprising memory network node 222A, memory network node 222B, memory network node 222C and memory network node 222D. For brevity, henceforth the term "node" is used to mean "memory network node" and the terms are used interchangeably. Optionally, the plurality of nodes are arranged in an identified pattern. Optionally, according to the identified pattern each node has an identified amount of neighbor directions. Optionally, the identified pattern is a two-dimensional grid, such that each node of the plurality of nodes optionally has four neighbor directions, and such that each node of the plurality of nodes is optionally connected on each of its neighbor directions to at most one other node of the plurality of memory network nodes. For example, when the four neighbor directions are enumerated as north, south, east and west, optionally node 222A in a corner of a two-dimensional grid is not connected to any node on the north and west, and is connected to one node on each of south and east.

Optionally, plurality of memory units 225A through 225D are connected by plurality of nodes 222, comprising nodes 222A through 222D. Optionally, each of plurality of nodes 222 is connected to one of plurality of memory units 225A through 225D. For example, node 222A is optionally connected to memory unit 225A. Similarly, nodes 222B through 222D are each optionally connected to memory units 225B through 225D respectively.

Optionally, interconnected memory grid 220 comprises a plurality of memory areas comprising memory areas 223A through 223D. Optionally, each of memory areas 223A through 223D is a static random access memory (SRAM) area. Optionally, one or more of memory areas 223A through 223D is addressable using a local memory address of interconnected memory grid 220. Optionally, one or more other of memory areas 223A through 223D is a stack-based-allocation memory area, where data is added or removed in a last-in-first-out (LIFO) manner and not via random access addressing. Optionally, each of the plurality of memory units is associated with one of the plurality of memory areas, for example memory unit 225A may be associated with memory area 223A, memory unit 225B may be associated with memory area 225B, memory unit 225C may be associated with memory area 223C, and memory unit 225D may be associated with memory area 225D.

Optionally, each of the plurality of memory units comprises one or more memory entry points (MEPs). For example, memory unit 225A optionally comprises one or more memory entry points 227A. Similarly, memory units 225B through 225D each optionally comprises one or more memory entry points 227B through 227D respectively.

Optionally, interconnected memory grid 220 comprises a plurality of memory interface units comprising memory interface unit (MIU) 229A, MIU 229B, MIU 229C and MIU 229D. Optionally, a memory management unit comprises circuitry for controlling and managing access to a memory area. Optionally, each of the plurality of nodes 222 is connected to the respective memory unit via one of the plurality of MIUs. For example, node 222A is optionally connected to memory unit 225A via MIU 229A, node 222B is optionally connected to memory unit 225B via MIU 229B, node 222C is optionally connected to memory unit 225C via MIU 229C, and node 222D is optionally connected to memory unit 225D via MIU 229D. Optionally, each MIU connects a node to a memory unit via one or more of the plurality of memory entry points of the memory unit. For example, MIU 229A is optionally connected to one or more memory entry points 227A. Similarly, MIUs 229B through 229D are each optionally connected to one or more memory entry points 227B through 227D respectively. Optionally, MIU 229A is configured to receive one or more memory access requests from one or more memory entry points 227A. Optionally, MIU 229A is configured to receive the one or more memory access requests from memory network node 222A. Optionally, MIU 229A is configured to access memory area 223A in response to the one or more memory access requests. Optionally, MIU 229A is configured to access one or more memory entry points 227A in response to the one or more memory access requests. Optionally, MIU 229A is configured to access memory network node 222A in response to the one or more memory access requests.

Optionally, each of the plurality of memory units comprises a memory management unit (MMU). For example, memory unit 225A optionally comprises memory management unit 228A. Similarly, memory units 225B through 225D each optionally comprises memory management unit 228B through 228D, respectively. Optionally, each of the plurality of memory interface units is connected to the memory management unit of the respective memory unit connected thereto. For example, MIU 229A is optionally connected to memory management unit 228A of memory unit 225A, MIU 229B is optionally connected to memory management unit 228B of memory unit 225B, MIU 229C is optionally connected to memory management unit 228C of memory unit 225C, and MIU 229D is optionally connected to memory management unit 228D of memory unit 225D. Optionally, MIU 229A is configured to access memory management unit 228A in response to the one or more memory access requests.

Reference is now made again to FIG. 2. Optionally, interconnected computing grid 210 comprises a plurality of reconfigurable logical elements 230. Optionally, interconnected computing grid 210 comprises an interconnect network, optionally connecting between at least some of the plurality of reconfigurable logical elements.

Henceforth, for brevity the term LE is used to mean a reconfigurable logical element.

Figure 3B:
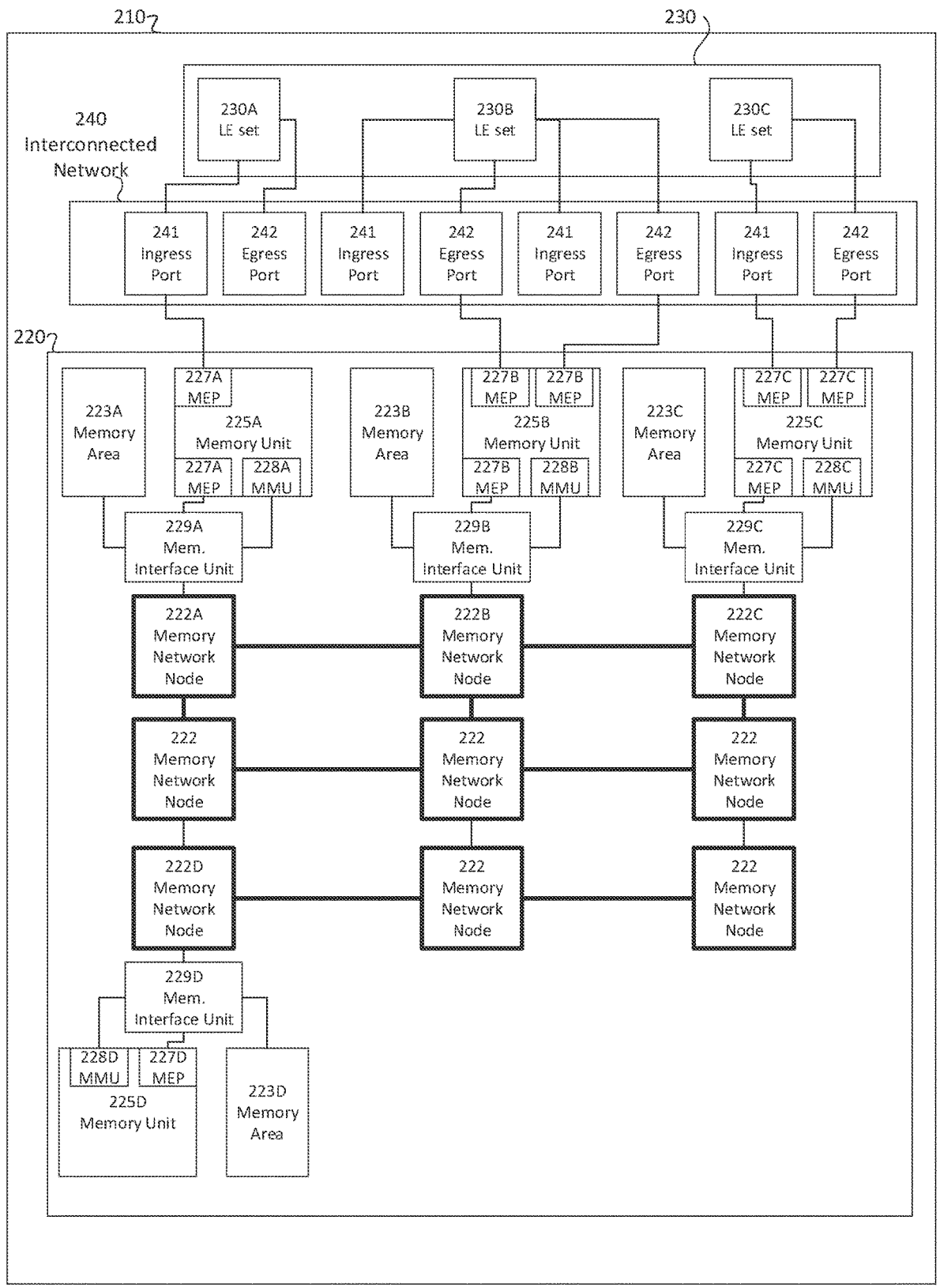
FIG. 3B is another schematic block diagram of an interconnected computing grid, according to some embodiments.

Reference is now made also to FIG. 3B, showing another schematic block diagram of interconnected computing grid 210, according to some embodiments. In such embodiments, plurality of LEs 220 comprises a plurality of sets of LEs comprising set of LEs 220A, set of LEs 220B and set of LEs 220C. Optionally, executing the software program by one or more computational devices 250 comprises configuring interconnected computing grid 210 to execute one or more of the plurality of basic blocks using one or more of set of LEs 220A, set of LEs 220B and set of LEs 220C. Optionally, each of sets of LEs 220A through 220C is associated with one of the plurality of memory units. Optionally, each of sets of LEs 220A through 220C is connected to the respective memory unit associated thereto, optionally via one or more of the respective memory unit's one or more memory entry points. For example, set of LEs 220A is optionally associated with memory unit 225A and is connected thereto via one or more memory entry points 227A. Similarly, set of LEs 220B is optionally associated with memory unit 225B and is connected thereto via one or more memory entry points 227B and set of LEs 220C is optionally associated with memory unit 225C and is connected thereto via one or more memory entry points 227C.

Optionally, interconnected network 240 comprises a plurality of ingress ports 241 and a plurality of egress ports 242 (each individually referred to as ingress port 241 and egress port 242 respectively). Optionally, set of LEs 230B is optionally connected to memory unit 225B via one or more memory entry points 227B additionally via ingress port 241 and egress port 242. Similarly, set of LEs 230B is optionally connected to memory unit 225B via one or more memory entry points 227B additionally via egress port 242 and some of plurality of ingress ports 241, and set of LEs 230C is optionally connected to memory unit 225C via one or more memory entry points 227C additionally via egress port 242 and ingress port 242.

Reference is now made again to FIG. 2. Optionally, interconnected computing grid 210 is connected to one or more device memory 260. An example of a device memory is a dynamic random access memory (DRAM) component. Optionally, the DRAM component is a three-dimensional stacked DRAM component.

Optionally, device 201 is connected to one or more hardware processor 270, optionally for the purpose of configuring interconnected computing grid 210. Optionally, one or more hardware processor 270 is one or more computational device 250.

To bypass a memory unit of the plurality of memory units, in some embodiments system 100 implements the following optional method. For brevity, henceforth the term "processing unit" is used to mean "one or more hardware processors" and the terms are used interchangeably.

Figure 4:
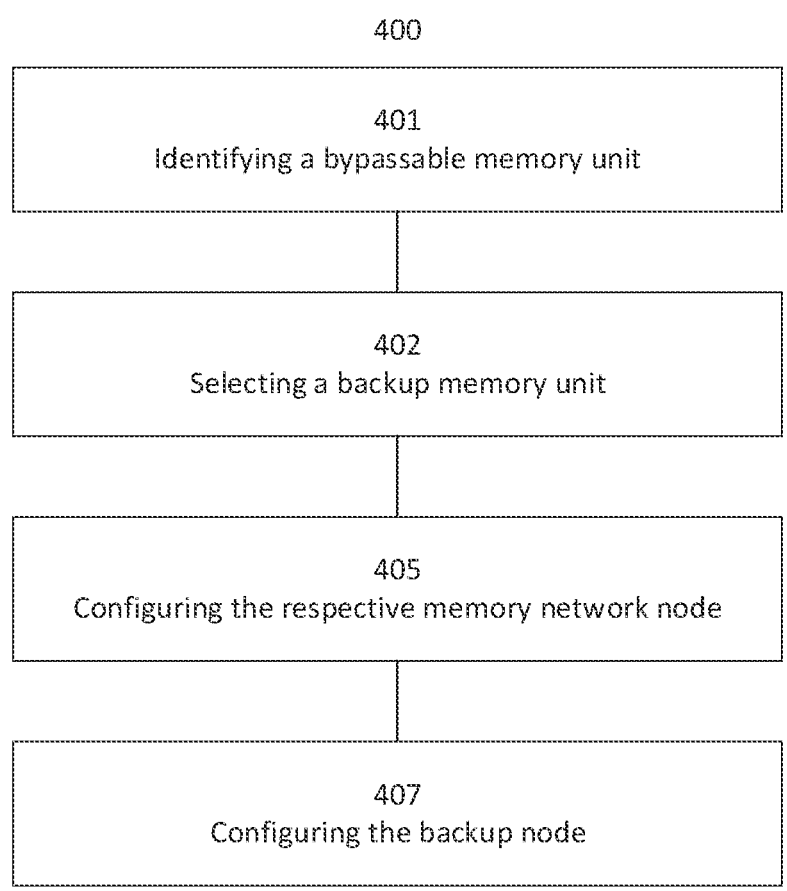
FIG. 4 is a flowchart schematically representing an optional flow of operations for bypassing a memory unit, according to some embodiments.

Reference is now made also to FIG. 4, showing a flowchart schematically representing an optional flow of operations 400 for bypassing a memory unit, according to some embodiments. In such embodiments, in 401 processing unit 270 identifies a bypassable memory unit 225A in the plurality of memory units. Optionally bypassable memory unit 225A is identified according to memory area 223A, connected thereto, being faulty. Optionally, bypassable memory unit 225A is identified for the purpose of optimizing execution of the software program, for example by configuring memory area 223A to be a scratch-pad memory area for set of LEs 230A.

Optionally, in 402, processing unit 270 selects memory unit 225B as a backup memory unit, where memory unit 225B is connected to a backup memory node 222B. Optionally, processing unit 270 selects backup memory unit 225B such that backup memory network node 222B connected to backup memory unit 225B is connected to memory network node 222A according to the identified pattern of plurality of network nodes 222, i.e. backup memory network node 222B is a neighbor of memory network node 222A according to the identified pattern.

In 405, processing unit 270 optionally configures memory node 222A connected to bypassable memory unit 225A to forward one or more memory access requests comprising an address in a first address range to backup memory network node 222B. Optionally, the one or more memory access requests comprise a memory command. A non-limiting list of examples of a memory command includes: a load command, a store command, an atomic load command, an atomic store command, an atomic fetch-and-operate command, a swap command, an atomic compare-and-swap command, a cache flush command and a cache commit command.

In 407, processing unit 270 optionally configures backup network node 222B to access backup memory unit 225B in response to the one or more memory access commands forwarded from memory unit 225A, optionally in addition to backup network node 222B accessing memory unit 225B in response to one or more other memory access requests comprising another address in a second address range. For example, when the first address range and the second address range differ only in one or more least significant bits, backup network node 222B may be configured to ignore the one or more least significant bits of an address in a received memory access request. For example, when backup memory network node 222B is configured to ignore one least significant bit of an address, backup network node 222B may respond to two address ranges. In another example, when each of plurality of memory network nodes is identified by a two-dimensional coordinate value, and when the received memory access request comprises a coordinate value of a target memory network node, when backup memory network node 222B is a neighbor of bypassable memory network node 222A their respective identifiers differ in one place only, allowing configuring backup memory network node 222B to ignore the one place when responding to a received memory access request. Optionally, backup memory unit 225B comprises one or more memory units of the plurality of memory units.

It will be clear that memory area 223B, associated with backup memory unit 225B may be required, in addition to handling the one or more other memory access requests it regularly received, to handle the one or more memory access that would otherwise be sent to bypassable memory unit 225A and handled by memory area 223A.

Various techniques may be used to provide storage for these additional accesses. For example, a memory unit may initially only make use of half of a storage capacity an associated memory area, and increase to use a full memory area in a case where the memory unit is configured to respond to the one or more memory access requests (the apparent wastage of half the storage area possibly justified by the ability to reduce cross-talk between memory bits and signal lines, allowing operation at a higher speed).

Alternatively, in a case where the memory unit is operating in a cache-like manner, the memory unit may make full use of a memory area associated thereto, with sharing of this area enabled by presence of an additional cache tag bit to allow caching both of a first address range and a second address range with differentiation between those two ranges.

Optionally, 407 is executed while set of LEs 230A executes one or more blocks of the plurality of basic blocks of the software program. Optionally, the one or more memory access requests are sent from set of LEs 230A to memory unit 225A via one or more memory entry points 227A.

Optionally, the first address range is one of an identified plurality of address ranges and the second address range is another of an identified plurality of address ranges. Optionally, one or more memory entry points 227A is configured to receive the address where the address is a physical memory address in a physical address space of one or more computational device 250, optionally addressing host memory 251. Optionally, one or more memory entry points 227A is configured to receive the address where the address is a virtual memory address in a virtual address space of one or more computational device 250, optionally addressing host memory 251. Optionally, one or more memory entry points 227A is configured to receive the address where the address is a local memory address of interconnected memory grid 220. Optionally, each of the identified plurality of address ranges is a range of local memory addresses of interconnected memory grid 220. Optionally, one or more memory entry points 227A is configured to receive the address where the address is a device memory address of device memory 260. Optionally, each of the identified plurality of address ranges is a range of device memory addresses of device memory 260. Optionally, one or more memory entry points 227A is configured to receive the address where the address is another device memory address of another memory component connected to another interconnected computing grid (not shown) connected to the interconnected computing grid.

Optionally, each of the identified plurality of address ranges is a range of local memory addresses of interconnected memory grid 222.

Optionally, prior to executing 407, memory network node 222A was configured to access bypassable memory unit 225A in response to one or more previous memory access requests addressed to the address in the first address range, and optionally backup memory network node 222B was configured to access backup memory unit 225B in response to one or more other previous memory access requests addressed to the second address in the second address range. Optionally, after executing 405 and 407, the one or more memory access requests addressed to the address in the first address range are received by bypassable memory network node 222A and instead of accessing bypassable memory unit 225A memory network node 222A forwards the one or more memory access requests to backup memory network node 222B, bypassing memory unit 225A. Optionally, backup memory network node 222B accesses memory unit 225B in response to the one or more memory access requests, optionally in addition to accessing memory unit 225B in response to the one or more other memory access requests directed to the other address in the second memory range.

Optionally, 401, 403, 405 and 407 are repeated for one or more other bypassable memory units of the plurality of memory units, for example for memory unit 225C.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant interconnected computing grids and interconnected memory grids will be developed and the scope of the terms "interconnected computing grid" and "interconnected memory grid" are intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment may include a plurality of "optional" features unless such features conflict.

Throughout this application, various embodiments may be presented in a range format. It should be understood that the description in range format is merely for convenience and brevity and should not be construed as an inflexible limitation on the scope of embodiments. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of embodiments, which are, for clarity, described in the context of separate embodiments, may also be provided in combination in a single embodiment. Conversely, various features of embodiments, which are, for brevity, described in the context of a single embodiment, may also be provided separately or in any suitable subcombination or as suitable in any other described embodiment. Certain features described in the context of various embodiments are not to be considered essential features of those embodiments, unless the embodiment is inoperative without those elements.

Although embodiments have been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the Applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A device for executing a software program by at least one computational device, comprising an interconnected computing grid, connected to the at least one computational device, comprising an interconnected memory grid comprising a plurality of memory units connected by a plurality of memory network nodes, each connected to at least one of the plurality of memory units;
   wherein configuring the interconnected memory grid comprises:
      selecting a backup memory unit of the plurality of memory units, connected to a backup memory network node of the plurality of memory network nodes; and
      configuring the backup memory network node to access the backup memory unit in response to at least one memory access request comprising an address in a first address range, in addition to accessing the respective at least one memory unit connected thereto in response to at least one other memory access request comprising another address in a second address range.

2. The device of claim 1, wherein configuring the interconnected memory grid further comprises identifying a bypassable memory unit in the plurality of memory units, where the bypassable memory unit is associated with the first address range ;.

3. The device of claim 2, wherein the bypassable memory unit is identified according to a faulty memory area connected thereto.

4. The device of claim 2, wherein the bypassable memory unit is one of a plurality of bypassable memory units identified in the plurality of memory units; and
   wherein configuring the interconnected memory grid further comprises, for at least one other bypassable memory unit of the plurality of bypassable memory units:
   selecting another backup memory network unit of the plurality of memory units connected to another backup memory network node of the plurality of memory network nodes;
   and
   configuring the other backup network node to access the other backup memory unit in response to at least one other memory access request, comprising another address in another first address range, in addition to accessing the other respective at least one memory unit connected thereto in response to at least one additional other memory access request comprising an additional other address in a second other address range.

5. The device of claim 2, wherein the plurality of memory nodes is arranged in an identified pattern; and
   wherein the backup memory network node is connected to the respective memory network node connected to the bypassable memory unit according to the identified pattern.

6. The device of claim 5, wherein the identified pattern is a two-dimensional grid, such that each node of the plurality of memory network nodes has four neighbor directions and is connected on each respective neighbor direction thereof to at most one other node of the plurality of memory network nodes.

7. The device of claim 1, wherein the interconnected computing grid further comprises a plurality of reconfigurable logical elements comprising a plurality of sets of reconfigurable logical elements;
   wherein the software program comprises a plurality of basic blocks;
   wherein executing the software program by the at least one computational device comprises configuring the interconnected grid to execute at least one of the plurality of basic block using at least one of the plurality of sets of reconfigurable logical elements; and wherein configuring the backup network node to access the backup memory unit is while the at least one set of reconfigurable logical elements executes the at least one basic block.

8. The device of claim 7, wherein each of the plurality of memory units further comprises a plurality of memory entry points;

wherein each of the plurality of sets of reconfigurable logical elements is associated with one of the plurality of memory units and connected thereto via at least one of the plurality of memory entry points thereof; and wherein the at least one memory access request is sent from the at least one set of reconfigurable logical elements to the respective at least one memory unit associated therewith via at least one memory entry point of the respective at least one memory unit's plurality of memory entry points.

9. The device of claim 8, wherein the at least one memory entry point is configured to receive from the at least one set of reconfigurable logical elements at least one additional other memory access request comprising at least one requested memory address selected from:

a physical memory address in a physical address space of the at least one computational device, a virtual memory address in a virtual address space of the at least one computational device, a local memory address of the interconnected memory grid, a device memory address of a memory component connected to the interconnected computing grid, and another device memory address of another memory component connected to another interconnected computing grid connected to the interconnected computing grid.

10. The device of claim 8, wherein the interconnected computing grid further comprises an interconnect network comprising a plurality of ingress ports and a plurality of egress ports; and wherein the at least one set of reconfigurable logical elements is connected to each of the at least one memory entry point via one of: an egress port of the interconnected network, and an ingress port of the interconnected network.

11. The device of claim 1, wherein the first address range is one of an identified plurality of address ranges;

wherein the second address range is another of the identified plurality of address ranges; and wherein each of the identified plurality of address ranges is one of:
  a range of local memory addresses of the interconnected memory grid, and
  a range of device memory addresses of a memory component connected to the interconnected computing grid.

12. The device of claim 1, wherein each of the plurality of memory units is associated with at least one memory area selected from: a memory area of a plurality of memory areas of the interconnected memory grid, and a stack-based-allocation memory area.

13. The device of claim 12, wherein each of the plurality of memory units is connected to the respective memory network node via a memory interface unit of a plurality of memory interface units of the interconnected memory grid;

wherein the respective memory interface unit connected to a memory unit of the plurality of memory units is further connected to:
  the respective at least one memory area associated with the memory unit;
  a memory management unit of the memory unit; and
  at least one of the plurality of memory entry points of the memory unit; and wherein the respective memory interface is configured to:
  receive a memory access request from one of: the at least one of the plurality of memory entry points connected thereto and the respective memory network node connected thereto; and
  access, in response to the memory access request, at least one of: the respective at least one memory area, the respective memory management unit connected thereto, the respective at least one memory entry point connected thereto, and the respective memory network node connected thereto.

14. The device of claim 1, wherein the at least one memory access request comprises a memory command selected from a group of memory commands consisting of: a load command, a store command, an atomic load command, an atomic store command, an atomic fetch-and-operate command, a swap command, an atomic compare-and-swap command, a cache flush command and a cache commit command.

15. A method for bypassing a bypassable memory unit of an interconnected memory grid comprising a plurality of memory units connected by a plurality of memory network nodes, each connected to at least one of the plurality of memory units, comprising:

selecting a backup memory unit of the plurality of memory units, connected to a backup memory network node of the plurality of memory network nodes; and configuring the backup memory network node to access the backup memory unit in response to at least one memory access request comprising an address in a first address range, in addition to accessing the respective at least one memory unit connected thereto in response to at least one other memory access request comprising another address in a second address range.

16. A system for executing a software program, comprising:

a device for executing the software program by at least one computational device, comprising an interconnected computing grid, connected to the at least one computational device, comprising an interconnected memory grid comprising a plurality of memory units connected by a plurality of memory network nodes, each connected to at least one of the plurality of memory units; and at least one hardware processor connected to the device and adapted for:
  selecting a backup memory unit of the plurality of memory units, connected to a backup memory network node of the plurality of memory network nodes; and
  configuring the backup memory network node to access the backup memory unit in response to at least one memory access request comprising an address in a first address range, in addition to accessing the respective at least one memory unit connected thereto in response to at least one other memory access request comprising another address in a second address range.

17. A software program product for executing a software program comprising:

a non-transitory computer readable storage medium;

first program instructions for selecting a backup memory unit of a plurality of memory units of an interconnected memory grid, where the plurality of memory units are connected by a plurality of memory network nodes, each connected to at least one of the plurality of memory units, where the backup memory unit is connected to a backup memory network node of the plurality of memory network nodes; and second program instructions for configuring the backup memory network node to access the backup memory unit in response to at least one memory access request comprising an address in a first address range, in addition to accessing the respective at least one memory unit connected thereto in response to at least one other memory access request comprising another address in a second address range;

wherein the first and second program instructions are executed by at least one computerized processor from the non-transitory computer readable storage medium.

* * * * *